(12) United States Patent
Case et al.

(10) Patent No.: US 6,254,463 B1
(45) Date of Patent: *Jul. 3, 2001

(54) CHEMICAL PLANAR HEAD DAMPENING SYSTEM

(75) Inventors: James R. Case, Brackney, PA (US); Gerald A. Kiballa, Owego, NY (US); Michael A. Shuman, Rome, PA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/169,760

(22) Filed: Oct. 9, 1998

(51) Int. Cl.[7] ............................................. B24B 21/04
(52) U.S. Cl. ........................ 451/121; 451/131; 451/184
(58) Field of Search ........................... 451/184, 131, 451/130, 121

(56) References Cited

U.S. PATENT DOCUMENTS

| | | | |
|---|---|---|---|
| 1,905,578 | * 4/1933 | Tucker | 99/589 |
| 3,055,151 | * 9/1962 | Salenblatt et al. | 451/21 |
| 3,208,187 | * 9/1965 | Ernst | 451/184 |
| 3,545,138 | * 12/1970 | Houston | 51/59 |
| 3,771,267 | * 11/1973 | Fortuniski | 51/215 |
| 3,942,288 | * 3/1976 | Schmidt | 451/184 |
| 4,399,637 | * 8/1983 | Steinback | 451/300 |
| 4,492,136 | * 1/1985 | Walker | 83/169 |
| 4,782,545 | 11/1988 | Aiassa | 15/77 |
| 5,197,230 | 3/1993 | Simpfendörfer et al. | 451/11 |
| 5,212,910 | 5/1993 | Breivogel et al. | 451/530 |
| 5,257,478 | 11/1993 | Hyde et al. | 451/287 |
| 5,569,063 | 10/1996 | Morioka et al. | 451/296 |
| 5,672,093 | 9/1997 | DuBois | 451/14 |
| 5,681,215 | 10/1997 | Sherwood et al. | 451/388 |

* cited by examiner

*Primary Examiner*—Allen Ostrager
*Assistant Examiner*—William Hong
(74) *Attorney, Agent, or Firm*—Schmeiser, Olsen & Watts; Arthur J. Samodovitz

(57) ABSTRACT

An improved polishing apparatus having a dampening system to prevent fluctuations between the planar head polishing device and the circuit panel. The dampening system includes a load actuation arm having a hydraulic-pneumatic cylinder which is controlled by an connected dampening circuit.

13 Claims, 5 Drawing Sheets

CHEMICAL PLANAR HEAD DAMPENING SYSTEM

BACKGROUND OF THE INVENTION

1. Technical Field

The present invention relates generally to the chemical mechanical polishing of printed circuit boards, and more particularly, to a planar head dampening system for a chemical mechanical polishing system.

2. Related Art

The strict process requirements of a chemical mechanical polishing system, used in the manufacture of printed circuit boards, necessitate the use of a compressible polishing device and the application of a low downward pressure, ranging from approximately 0.25 to 10 psi. These requirements are essential to the polishing process due to the delicate nature of the surface contours of the workpiece. Use of a less compressible polishing device or attempting to increase the down pressure could eliminate these desired surface contours or otherwise damage the workpiece. Unfortunately, gravity alone is insufficient to hold the polishing device in contact with the workpiece while polishing. Rather, in the absence of an applied down pressure, the polishing device floats above the workpiece without polishing its surface. Therefore, a polishing system utilizing a planar head polishing device having a low durometer compressible core in conjunction with the application of a low down pressure are currently used in the industry.

The requisite down pressure is typically supplied by a compressed air source. However, when the surface of the planar head polishing device was upgraded to a more aggressive material, a destructive phenomenon known as "high frequency cycling" was encountered. High frequency cycling results when the planar head is brought into contact with the workpiece, and due to its coarse polishing surface, the planar head begins to grip the surface of the workpiece and "bite-in." This causes the compressible inner core of the planar head to deform, forcing it in the opposite direction intended. Due to the compressible nature of the air providing the down pressure, the upward force exerted by the deformed planar head produces a rebounding effect. These fluctuations in contact between the polishing device and the workpiece produce proportionate fluctuations in the planar head impression and the process rate of the workpiece. Additionally, premature failure of the planar head lowering device, inconsistent surface conditions of the planar head and non-uniform planarization of the workpiece surface can result.

The high frequency cycling appears to be attributed to the combination of the low durometer inner core of the planar head and the low down pressure. In an attempt to remedy the problem, planar heads composed of different durometer materials were tested. However, these alternative materials created further processing problems and, therefore, offered no solution. In the alternative, various shock absorbers were considered to eliminate the effects of the compressed air. However, none produced a regressive non-compressible system, which would allow the pressure to remain constant throughout polishing. These alternatives were also ineffective since they would be destroyed by the harsh chemical environment of the system.

Therefore, there is clearly a need to develop a chemical mechanical polishing device which eliminates the occurrence of high frequency cycling.

SUMMARY OF THE INVENTION

The present invention provides a device that will overcome the above-identified problems through the use of a hydraulic-pneumatic dampening system.

A first general aspect of the present invention provides a polishing apparatus having at least one polishing device and a support platform comprising, a load actuating arm, mounted at a first end to the support platform and at a second end to the polishing device, and a dampening circuit connected to the load actuating arm to prevent fluctuations. This aspect allows for the application of a constant low down pressure of the polishing device, thereby eliminating the occurrence of fluctuations between the planar head and the circuit panel.

A second general aspect of the present invention includes a polishing apparatus comprising, a conveyor mounted to a platform to transport a workpiece to a polishing area of the apparatus, and a plate pivotally secured above the conveyor carrying an at least one polishing device rotatably mounted therein. This aspect provides for the apparatus to transport a circuit panel to the polishing area of the apparatus and for lowering the polishing device.

A third general aspect of the present invention includes a polishing apparatus having at least one polishing device and a support platform comprising, a conveyor mounted to the platform to transport a circuit panel to the at least one planar head assembly, a plate pivotally secured above the conveyor, a planar head rotatably mounted within the plate, a load actuating arm, mounted at a first end to the support platform and at a second end to the plate, and a dampening circuit connected to the load actuating arm to prevent fluctuations. This aspect provides similar advantages to that of the first and second aspects.

A fourth general aspect of the present invention includes a polishing apparatus having a dampening system to prevent fluctuations. This aspect provides similar advantages to that of the first and third aspects.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DETAILED DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiments.

Figure 1:
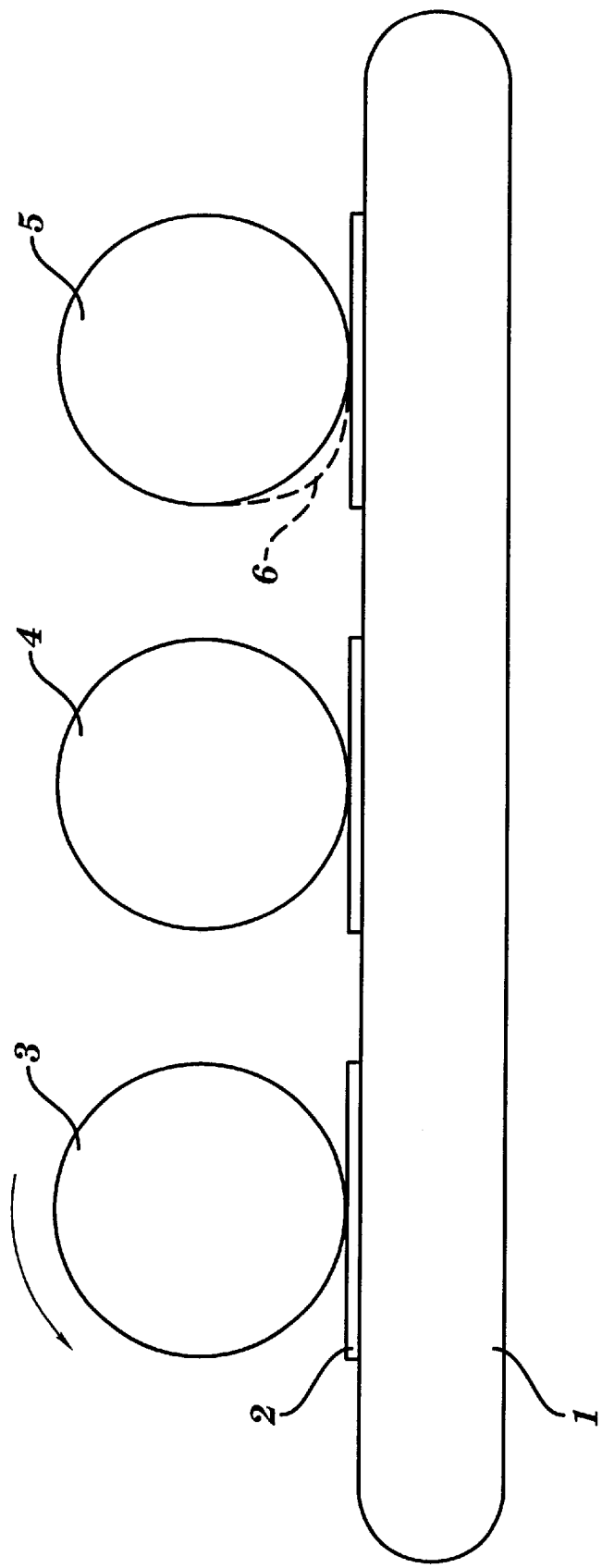
FIG. 1 depicts a cross-sectional view of the deformation of a planar head upon contact with a workpiece, which necessitated the present invention.

FIG. 1 shows a cross-sectional view of a deformation 6 of a planar head 3 when brought into contact with a workpiece 2 carried on a delivery system 1, such as a conveyor, a robotic armature, a turn table, etc. While planar head 4 shows the ideal contact scenario, planar head 5 depicts the deformation, illustrated by dashed line 6, that causes planar head 5 to rebound away from workpiece 2, thereby producing non-uniform planarization.

Figure 2:
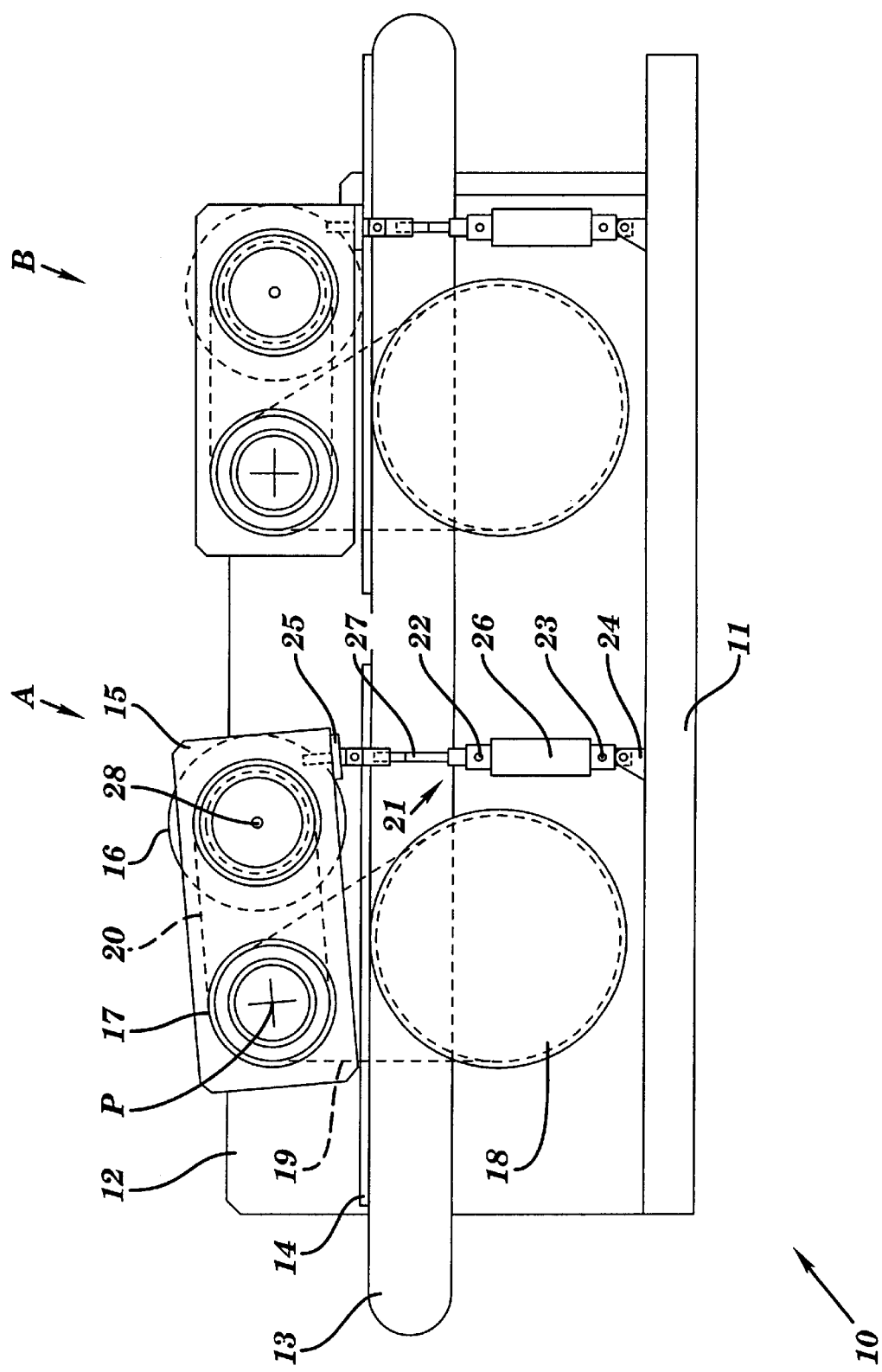
FIG. 2 depicts a cross-sectional view of a chemical mechanical polishing assembly in accordance with the present invention.

FIG. 2 depicts a cross-sectional view of a chemical mechanical polishing assembly 10, in accordance with the present invention. A back panel 12 is attached perpendicularly to a platform 11. A conveyor 13, or other means of delivery, is mounted to back panel 12, and carries a workpiece 14 to the various planar head assemblies A, B, etc., to be polished. It should be appreciated that an infinite succession of planar head assemblies may be used in accordance with the invention, and it is not limited to number shown in the figures. A planar head 16, rotatably mounted about a solid shaft 28 within a plate 15, is propelled by a pulley 17 via belts 19 and 20, which are powered by a motor 18. It should be recognized that chains, ropes, etc., could be used to propel planar head 16. Further, motor 18 could be placed in alignment with planar head 16, thereby eliminating the need for pulley 17. A load actuation arm 21, designed to raise and lower plate 15 pivotally about a pin P, is attached at one end to platform 11 via a bracket 24, in this depiction an L-shaped bracket is used, and at the other end to plate 15 via a bracket 25. Load actuation arm 21 includes a hydraulic-pneumatic cylinder 26, fittings 22 and 23 located on both ends of cylinder 26, and an arm 27 slidably mounted within cylinder 26.

Figure 5:
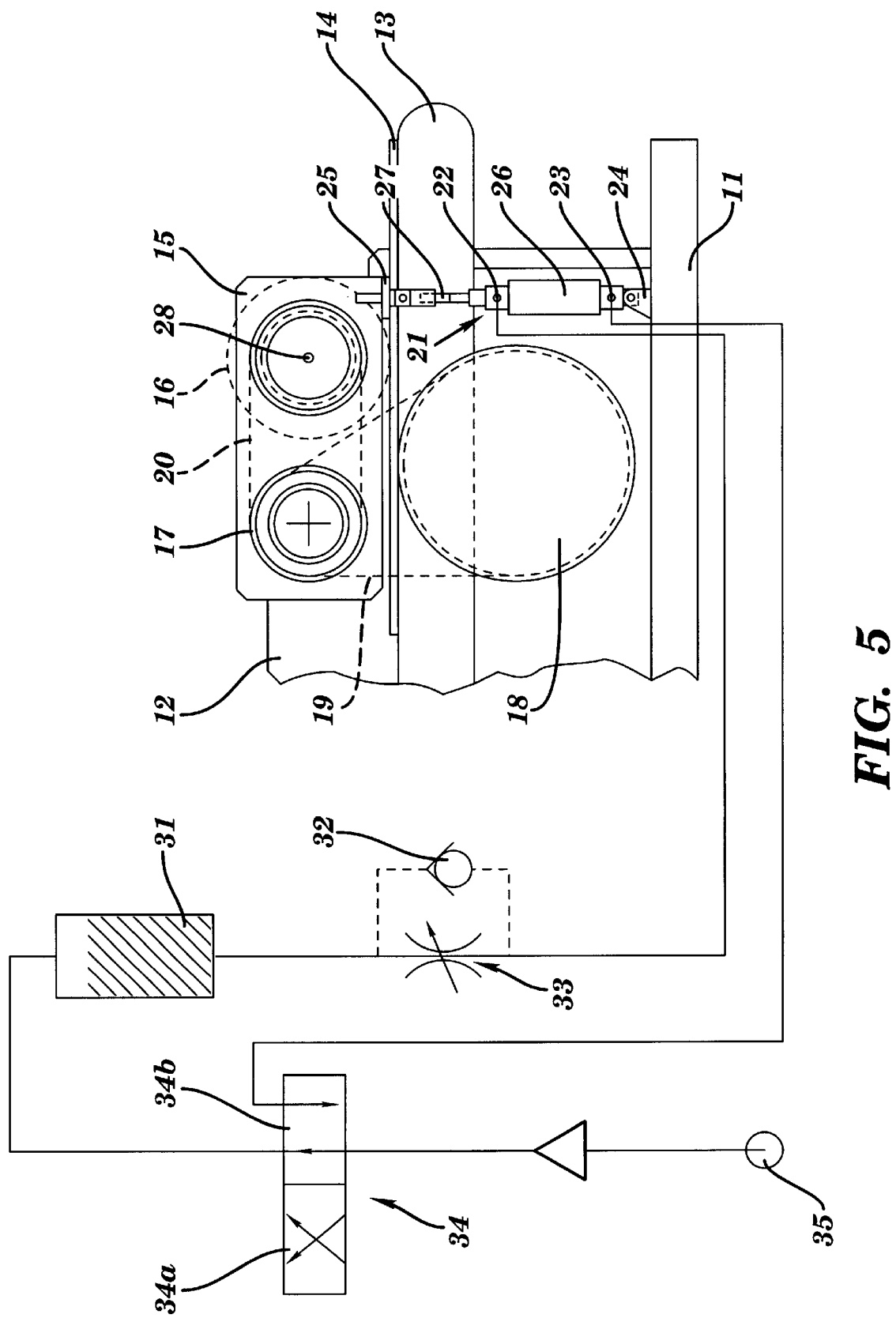
FIG. 5 depicts a dampening circuit of the chemical mechanical polishing assembly in accordance with the present invention.
Figure 6:
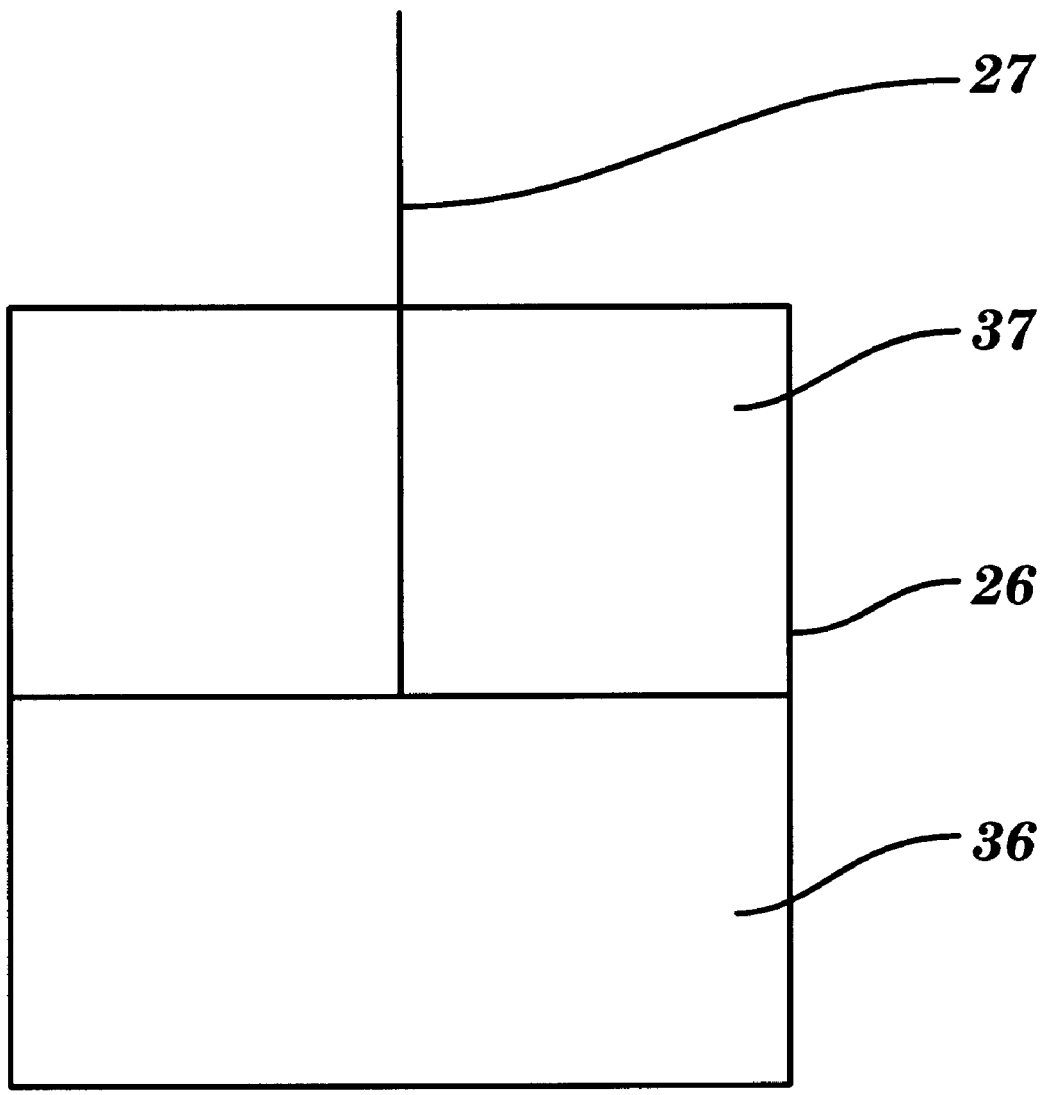
FIG. 6 depicts a cross-sectional view of a hydraulic-pneumatic cylinder in accordance with the present invention.

FIG. 5 shows a cross-sectional view of the dampening circuit which controls the movement of load actuation arm 21. To lower planar head 16, a two position-four way valve 34 is placed in position 34b. This allows compressed air from supply 35 to apply pressure to a fluid reservoir 31, which supplies a chamber 37 of cylinder 26 (FIG. 6), with a non-compressible medium having a low viscosity, approximately 0.9 to 1.0 centipoises. This draws arm 27 into cylinder 26 and lowers planar head 16. A flow control area 33 includes a check valve 32 which permits the transmission medium from fluid reservoir 31 to flow unrestricted in one direction only, thereby preventing back flow and maintaining constant pressure in cylinder 26 during polishing. When polishing is complete, two position-four way valve 34 is switched to position 34a, thereby redirecting compressed air from supply 35 into chamber 36 of cylinder 26 (FIG. 6), and allowing chamber 36 to fill with compressed air and raise planar head 16. It should be appreciated that supply 35 is not limited to the use of compressed air and may be replaced with other acceptable mediums, i.e., hydraulic fluid.

Figure 3:
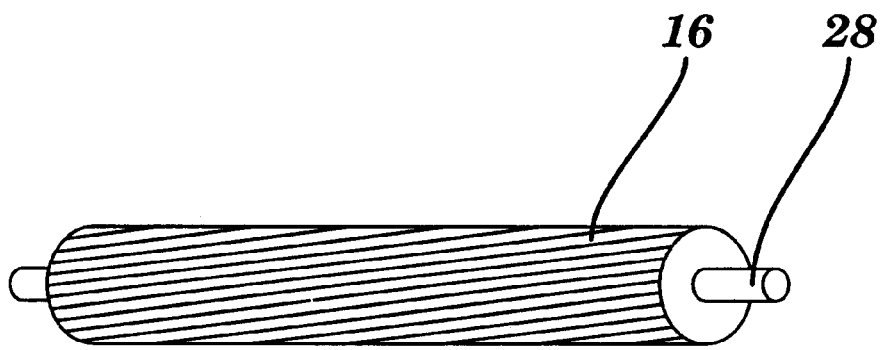
FIG. 3 depicts a planar head in accordance with the present invention.
Figure 4:
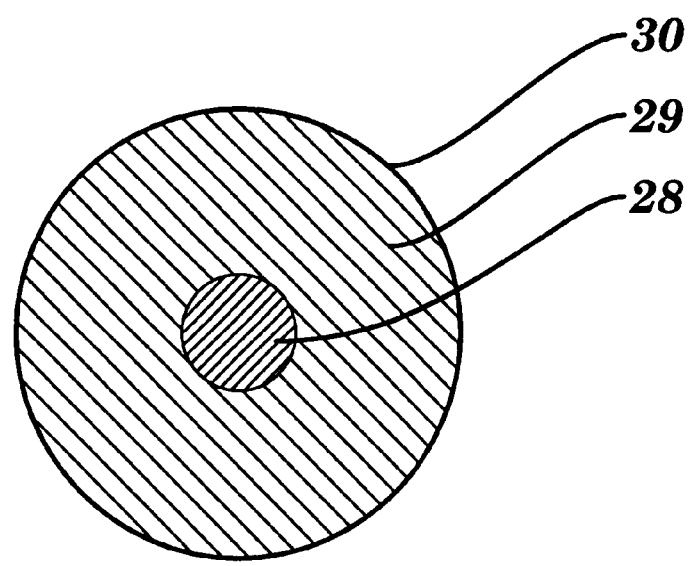
FIG. 4 depicts a cross-sectional view of a planar head in accordance with the present invention.

FIG. 3 depicts the configuration of planar head 16 having solid shaft 28. FIG. 4 shows a cross-sectional view of planar head 16, which includes solid shaft 28, an inner core 29 and an outer shell 30. Solid shaft 28 is preferably composed of titanium. Inner core 29 is preferably composed of a low durometer material, i.e., rubber. Outer shell 30 is preferably a polishing paper material. In the alternative, outer shell 30 may be composed of a higher durometer material than inner core 29 in conjunction with a polishing paper. However, these layers are not limited to the use of these specific materials.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit ans scope of the invention as defined in the following claims.

We claim:

1. A polishing apparatus comprising:
    a conveyor mounted to a platform to transport a workpiece to a polishing area of the apparatus;
    a plate pivotally secured above the conveyor carrying an at least one polishing device rotatably mounted therein, wherein the at least one polishing device comprises a compressible planar head assembly; and
    a dampening circuit to prevent fluctuations of the polishing apparatus against the workpiece.

2. The polishing apparatus of claim 1, further including a load actuating arm mounted at a first end to the support platform and at a second end to the plate and the dampening circuit connected thereto.

3. The polishing apparatus of claim 2, wherein the load actuating arm is a hydraulic-pneumatic cylinder.

4. The polishing apparatus of claim 1, wherein the dampening circuit further includes a two position-four way valve, which regulates the flow of air from a compressed air source leading to a fluid reservoir which supplies a transmission medium to the load actuating arm, a check valve and a flow control valve located between the fluid reservoir and the load actuating arm.

5. The polishing apparatus of claim 4, wherein the fluid reservoir contains a non-compressible medium having a viscosity of about 0.9 to 1.0 centipoises.

6. A polishing apparatus having at least one polishing device and a support platform comprising:
    a conveyor mounted to the platform to transport a circuit panel to the at least one planar head assembly;
    a plate pivotally secured above the conveyor;
    a compressible planar head rotatably mounted within the plate;
    a load actuating arm, mounted at a first end to the support platform and at a second end to the plate; and
    a dampening circuit connected to the load actuating arm to prevent fluctuations of the polishing apparatus against a workpiece.

7. The polishing apparatus of claim 6, wherein the planar head is composed of a solid shaft, an inner core and an outer shell.

8. The polishing apparatus of claim 7, wherein the inner shaft is titanium.

9. The polishing apparatus of claim 7, wherein the inner core is a low durometer material.

10. The polishing apparatus of claim 7, wherein the outer shell is a polishing paper material or a higher durometer elastomer material than the inner core.

11. The polishing apparatus of claim 6, wherein the load actuating arm is a hydraulic-pneumatic cylinder.

12. The polishing apparatus of claim 6, wherein the dampening circuit further includes a two position-four way valve, which regulates the flow of air from a compressed air source leading to a fluid reservoir which supplies a transmission medium to the load actuating arm, a check valve and a flow control valve located between the fluid reservoir and the load actuating arm.

13. The polishing apparatus of claim 12, wherein the fluid reservoir contains a non-compressible medium having a viscosity of about 0.9 to 1.0 centipoises.

* * * * *